(12) United States Patent
Jaquette et al.

(10) Patent No.: US 6,271,775 B1
(45) Date of Patent: Aug. 7, 2001

(54) METHOD FOR REDUCING DATA EXPANSION DURING DATA COMPRESSION

(75) Inventors: Glen A. Jaquette, Tucson, AZ (US); Francis A. Kampf, Jeffersonville, VT (US); Oscar C. Strohacker, Leander, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/379,821

(22) Filed: Aug. 24, 1999

(51) Int. Cl.[7] .................................................. H03M 7/00
(52) U.S. Cl. .................................. 341/87; 341/51
(58) Field of Search .......................... 341/51, 87

(56) References Cited

U.S. PATENT DOCUMENTS

| | | | |
|---|---|---|---|
| 3,394,352 | * | 7/1968 | Wernikoff et al. ...................... 341/67 |
| 4,870,415 | * | 9/1989 | Van Maren et al. ..................... 341/94 |
| 5,049,881 | | 9/1991 | Gibson et al. . |
| 5,177,480 | * | 1/1993 | Clark ........................................ 341/51 |
| 5,353,024 | | 10/1994 | Graybill . |
| 5,686,912 | | 11/1997 | Clark, II et al. . |
| 6,008,743 | * | 12/1999 | Jacquette ................................. 341/51 |

* cited by examiner

*Primary Examiner*—Howard L. Williams
(74) *Attorney, Agent, or Firm*—Schmeiser, Olsen & Watts; Robert A. Walsh

(57) ABSTRACT

A method of reducing data expansion during data compression is provided that allows the coding scheme used to compress data to be swapped between two or more coding schemes. Specifically, a coding window is provided that allows analysis of the compression potential of data within the coding window. The data within the coding window then is analyzed to determine the compression potential of the data. If the compression potential of the data exceeds a first predetermined value, the coding scheme used to compress the data within the coding window is swapped from one coding scheme to another. Preferably the first predetermined value is programmable and is related to the bit cost required to swap back and forth between coding schemes. The two preferred coding schemes are ALDC Lempel-Ziv 1 coding and a pass-through coding scheme wherein raw data is passed unencoded.

26 Claims, 8 Drawing Sheets

METHOD FOR REDUCING DATA EXPANSION DURING DATA COMPRESSION

CROSS-REFERENCE TO RELATED APPLICATIONS

The present application is related to commonly assigned U.S. patent application Ser. No. 09/379,864, filed on even date herewith which is hereby incorporated by reference herein in its entirety.

FIELD OF THE INVENTION

The present invention relates to data compression schemes, and more particularly to a method for reducing the expansion of data during data compression.

BACKGROUND OF THE INVENTION

The use of data compression or "coding" schemes to increase the storage capacity of storage media (e.g., tape drives, hard drives, etc.) is well known in the art, and can result in significant increases in data storage capacity. However, the efficiency with which data may be compressed depends on the specifics of the compression scheme employed and the type of data compressed. Depending on data entropy, certain data types may be incompressible or inefficiently compressible by the compression scheme, and may cause the data to occupy more memory space than when the data is in an uncompressed format (i.e., data expansion). For example, in many implementations of Lempel-Ziv 1 coding including IBM's adaptive lossless data compression (ALDC), LZS (QIC 122), etc., highly random data can expand in size up to 12.5% (e.g., from 60,000 bytes uncompressed to 67,500 bytes compressed).

When data expansion occurs during data compression, the very purpose of performing data compression (e.g., to increase the storage capacity of a storage media) is subverted. Accordingly, a need exists for reducing the expansion of data during data compression.

SUMMARY OF THE INVENTION

To overcome the needs of the prior art, a method of reducing data expansion during data compression is provided that determines when the coding scheme used to compress data should be swapped between two or more coding schemes. Specifically, a coding window is provided that allows analysis of the compression potential of data therewithin. The data within the coding window is analyzed to determine the compression potential of the data. If the compression potential of the data reaches a first predetermined value, the coding scheme used to compress the data within the coding window is swapped from one coding scheme to another (e.g., the coding scheme used to compress the data within the coding window is swapped to a new coding scheme and the data within the coding window is then compressed using the new coding scheme). As used herein, "reaches a predetermined value" means has an absolute magnitude greater than or equal to an absolute magnitude of the predetermined value. Preferably the first predetermined value is programmable and is related to the bit cost required to swap back and forth between coding schemes. The two preferred coding schemes are ALDC Lempel-Ziv 1 (hereinafter "LZ1") coding and a passthrough (hereinafter "RAW") coding scheme wherein raw data is passed unencoded.

Analysis of the compression potential of data within the coding window may be performed by many techniques, but preferably comprises computing a compression potential sum $S_p$ for p data bytes within the coding window according to the formula:

$$S_p = \sum_{n=1}^{p} f(W[n])$$

where $f(W[n])$ equals the compression potential of the nth data byte within the coding window. Swapping the coding scheme used to compress the data within the coding window from one scheme to another is performed if the compression potential sum $S_p$ reaches the first predetermined value.

If the compression potential for each data byte within the coding window is analyzed (or if a partition boundary is reached for the data being compressed) before the first predetermined value is reached, swapping of the coding scheme used to compress the data within the coding window between coding schemes preferably is performed if the compression potential sum $S_p$ reaches a second predetermined value.

A computer program product for use in a data compression process having two or more coding schemes also is provided. The inventive program product is carried by a medium readable by a computer (e.g., a carrier wave signal, a floppy disc, a hard drive, a random access memory, etc.). The computer readable medium comprises means for providing a coding window that allows analysis of the compression potential of data therewithin, means for analyzing the data within the window and means for swapping the coding scheme used to compress the data within the window from one scheme to another if the potential for compression reaches a predetermined value.

By thus analyzing the compression potential of data bytes prior to coding, and by selecting an appropriate coding scheme based thereon, data compression may be performed with the potential for minimal data expansion. Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
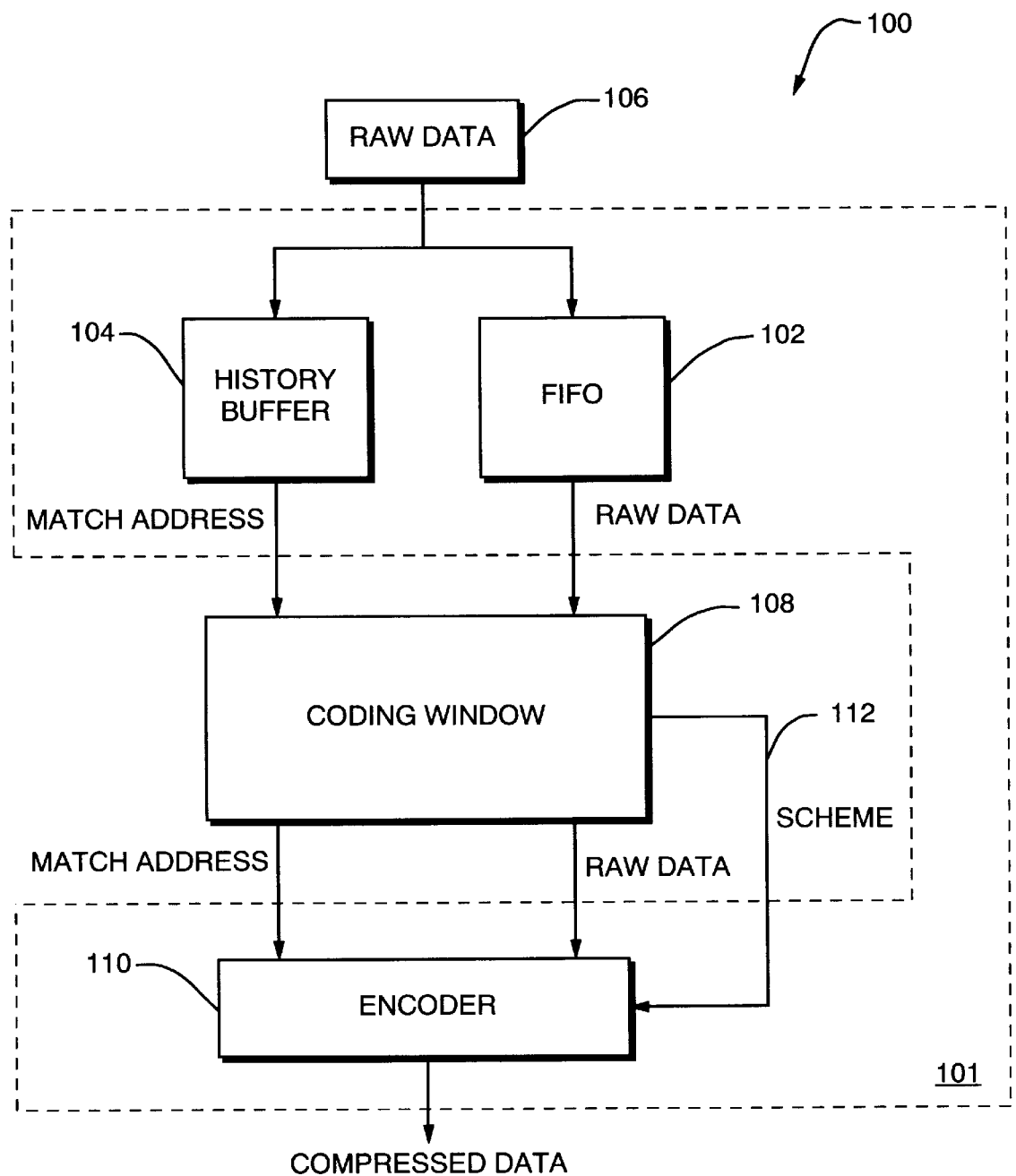
FIG. 1 is a block diagram of an inventive data compression system for coding data while reducing potential data expansion in accordance with the present invention.

FIG. 1 is a block diagram of an inventive data compression system 100 for coding data while reducing potential data expansion in accordance with the present invention. The inventive system 100 is described herein with reference to ALDC Lempel-Ziv 1 (LZ1) coding and a typical hardware implemented LZ1 encoder circuit 101. However, it will be understood that the invention may be employed with other coding schemes and with other encoder embodiments (e.g., software based encoder embodiments).

The inventive data compression system 100 comprises a first-in first-out (FIFO) buffer 102 and a history buffer 104 coupled to a source of unencoded or "raw" data bytes (e.g., raw data byte source 106), a coding window 108 coupled to both the FIFO buffer 102 and the history buffer 104, and an encoder 110 coupled to the coding window 108. The raw data byte source 106 may comprise any conventional data source such as a host computer, a DRAM, a tape drive, a CD-ROM, a hard disk or the like. The FIFO 102, the history buffer 104 and the encoder 110 form the hardware encoder circuit 101 as shown.

The history buffer 104 comprises a random access memory (RAM) that stores one 8-bit ASCII character per address and preferably is 512 bytes, 1 kilobyte or 2 kilobytes in size. As described below, the history buffer 104 receives raw data bytes from the raw data byte source 106, generates "history" information for each received data byte (e.g., a match address) and outputs each data byte's history information to the coding window 108. Because of the time required to generate history information for each data byte supplied from the raw data byte source 106, the FIFO buffer 102 introduces a delay to the raw data byte stream supplied from the raw data byte source 106 to the coding window 108 so that each data byte supplied from the raw data byte source 106 arrives at the coding window 108 at the same time as the history information for the data byte (e.g., generated by the history buffer 104).

As described further below with reference to FIGS. 2–4, the coding window 108 comprises an inventive coding selection algorithm implementable in either hardware, software or a combination thereof that examines subsets of the raw data bytes supplied from the FIFO buffer 102 and the history information supplied from the history buffer 104 to affect coding of the raw data byte stream supplied from the raw data byte source 106 with minimal data expansion. Specifically, subsets of raw data bytes preferably having a maximum size of 32, 64 or 128 data bytes (e.g., by employing a 32, 64 or 128 byte coding window) are examined employing the inventive algorithm to determine whether, on average, the raw data bytes within each subset require fewer bits if coded using LZ1 coding or if left as a raw data bytes (i.e., if coded using a pass-through or "raw" coding scheme that merely passes the raw data bytes through the encoder 110 unencoded. Based on this coding efficiency determination, the coding window 108 issues a scheme selection signal ("scheme") to the encoder 110 (e.g., via a scheme selection control line 112) to select either LZ1 coding or raw coding for each data byte subset. Note that the size of each data byte subset coded may be less than or equal to the size of the coding window 108.

To understand the operation of the inventive coding selection algorithm, it is first necessary to understand LZ1 coding. Accordingly, LZ1 coding is now briefly described.

The LZ1 compression algorithm compresses data within a data stream comprising data bytes of 1-byte "characters" (e.g., 8-bit ASCII code) by examining the data stream for repeated sequences of characters. If repeated sequences of characters are identified, the address within the history buffer 104 of the first occurrence of the repeated sequences of characters (i.e., the displacement) and the number of characters in the repeated sequence (i.e., the length) are output in place of all but the first occurrence of the repeated sequence of characters.

In accordance with the LZ1 compression algorithm, each non-repeated character is coded as a raw data byte termed a "literal", and each repeated character sequence other than the first occurrence of the repeated character sequence is coded as a "copy pointer" comprising the displacement and length values for the first occurrence of each repeated sequence of characters.

When a data byte is coded as a literal, an extra bit (e.g., 0) is added to the data byte to identify the data byte as a literal. Similarly, when a repeated sequence of characters is coded as a copy pointer, an extra bit (e.g., 1) is added to the length and displacement information for the repeated sequence to identify the information as a copy pointer.

The extra bit added to raw data bytes to identify the bytes as literals effectively expands the size of each raw data byte by one bit. Thus, in a highly random data stream (e.g., a data stream having relatively few repeated sequences of characters) data expansion can result from LZ1 data coding. In the worst case situation with no repeated sequences of characters, the effective size of the data stream may expand by 12.5%. The inventive data compression system 100 avoids this form of data expansion.

In general, the inventive data compression system 100 avoids data expansion during LZ1 coding of a data stream by analyzing the data stream as a series of data subsets. A determination is made whether the data bytes within each subset are more efficiently compressed by using the LZ1 coding scheme or by using the RAW coding scheme which passes the raw data bytes in an uncoded format (e.g., a format that does not require an extra bit to identify a raw data byte as a literal). In this manner, highly random data is not compressed and data expansion (due to the extra bit that identifies raw data bytes as literals within the LZ1 coding scheme) is avoided.

With reference to FIG. 1, a data stream comprising a plurality of data bytes is transferred byte-by-byte from the raw data byte source 106 to the history buffer 104, and to the coding window 108 via the FIFO buffer 102. For each data byte the history buffer 104 receives from the raw data byte source 106, in addition to storing the data byte, the history buffer 104 outputs a match address (e.g., the displacement value of any matching data byte) to the coding window 108. The inventive coding selection algorithm then uses this information to determine the most efficient coding scheme for compressing the data supplied from the raw data byte source 106.

To determine the most efficient coding scheme to employ, the "benefit" of compressing each data byte received from the raw data byte source 106 (i.e., the compression potential of each data byte received from the raw data byte source 106) is numerically quantified and is added to a "compression potential sum". The compression potential sum represents the overall benefit of compressing all of the data bytes whose compression potentials comprise the compression potential sum. In general, if the compression potential sum exceeds a predetermined value (e.g., the "cost" of switching back and forth between coding schemes as described below), then the data bytes that contributed to the compression potential sum are coded with a first coding scheme (e.g., LZ1 or RAW); otherwise, a second coding scheme is employed to code the data bytes (e.g., RAW or LZ1), as described below with reference to FIGS. 2–4. The maximum number of data bytes that contribute to the compression potential sum is set by the size of the coding window 108.

Figure 2A:
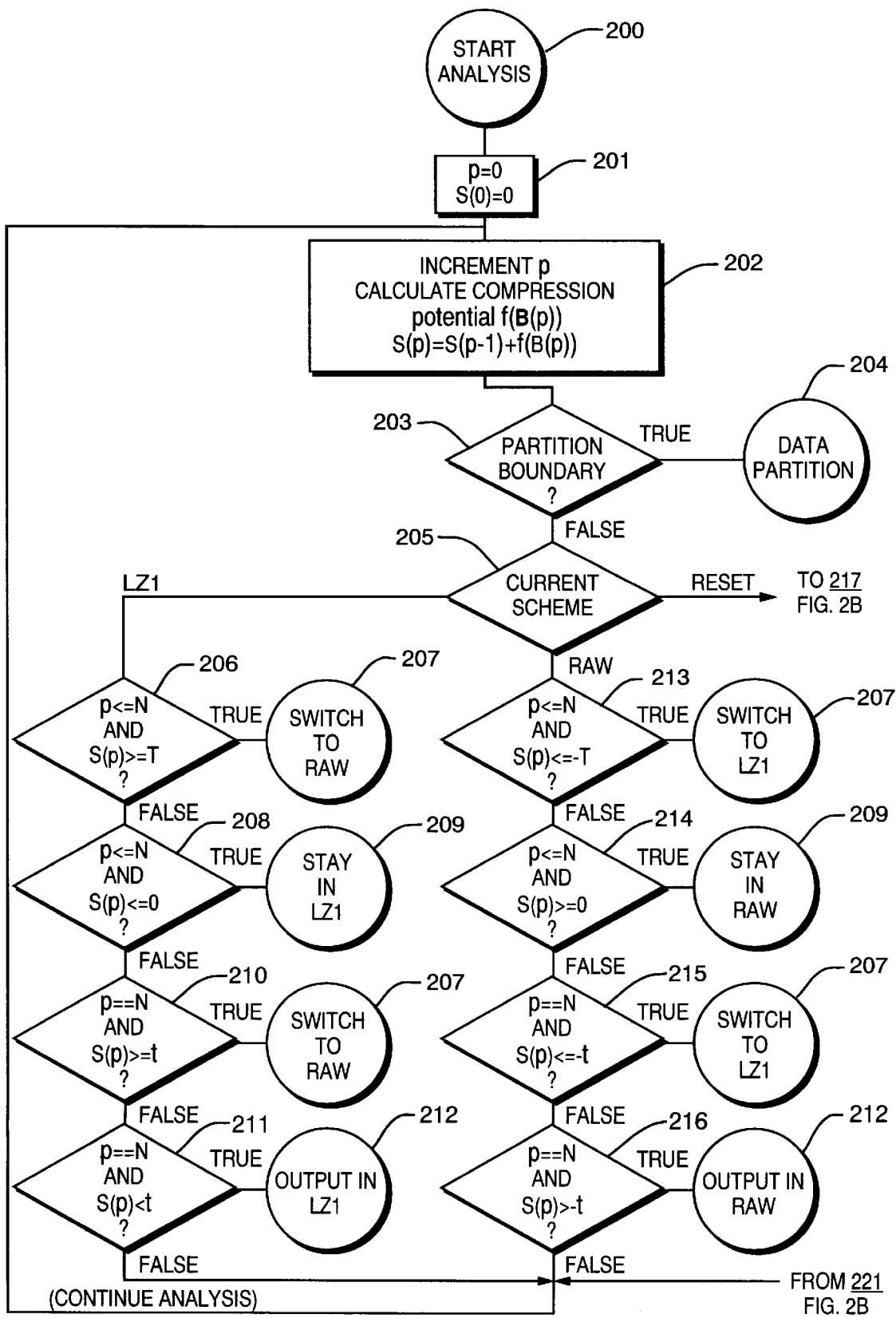
FIGS. 2(a)–2(c) are a flowchart of an inventive coding selection algorithm's general operation.
Figure 2B:
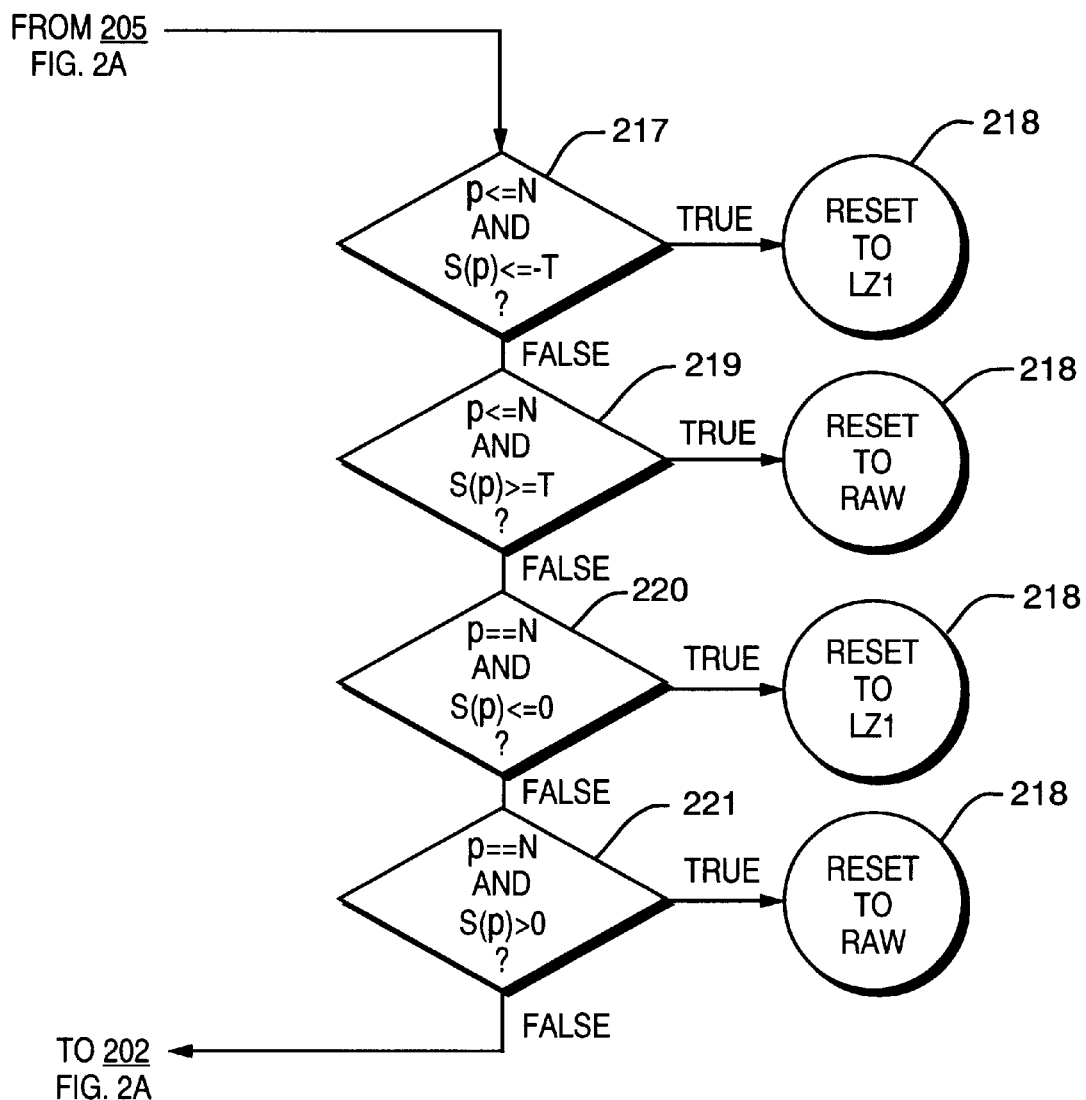
Figure 2C:
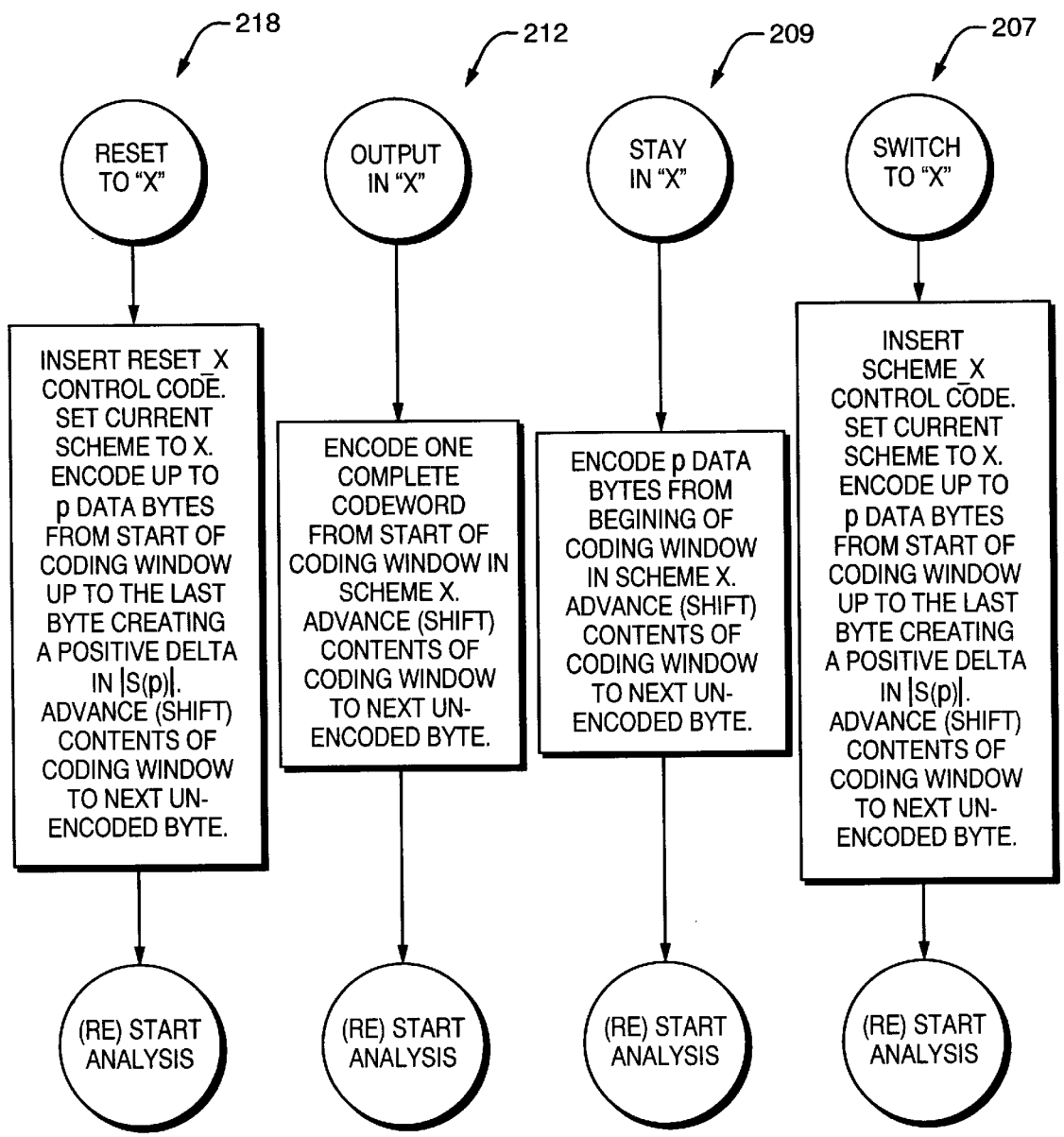

FIG. 2 is a flowchart of the inventive coding selection algorithm's general operation. The inventive coding selection algorithm starts at step 200. Thereafter, in step 201, a data byte pointer (p) is set to zero, as is the compression potential sum (S(p)).

In step 202, a data byte is obtained from the raw data byte source 106 and becomes part of the coding window 108, and the data byte pointer (p) is incremented by one. The compression potential f(B(p)) of the data byte then is computed, as described below with reference to FIG. 4, and is added to the compression potential sum S(p). The compression potential sum S(p) thus represents the overall compression potential for the data bytes within the coding window 108.

In step 203, a determination is made as to whether all data bytes within the raw data byte source 106 have been analyzed (e.g., whether the end of a data partition has been reached). If so, subroutine 204 is invoked as described below with reference to FIG. 3; otherwise, control passes to step 205.

In step 205, the most recently employed coding scheme (i.e., the current coding scheme) is identified. If the current coding scheme is LZ1 coding, the branch containing steps 206–211 is traversed; if the current coding scheme is RAW coding the branch containing steps 213–216 is traversed; and if the current coding scheme is unknown (e.g., at system startup) the branch containing steps 217–221 is traversed.

With reference to steps 206–211 (e.g., assuming the current coding scheme is LZ1 coding), data byte pointer (p) and the compression potential sum S(p) are examined to determine if the data byte pointer (p) is less than or equal to the maximum number (N) of data bytes allowed within the coding window (e.g., 32, 64 or 128 bytes) and if the compression potential sum S(p) is greater than or equal to a first predetermined threshold (T) for swapping coding schemes.

The first threshold (T) preferably is based on the "cost" (in terms of extra bits) required to swap from one coding scheme to another coding scheme and back again. In the preferred implementation of the LZ1 coding scheme, control commands are represented by 12 bits plus an additional bit (e.g., 1) which identifies the control command as a control command. Therefore, the effective cost of swapping from one coding scheme to another is the 13 bits required to issue a control command that executes the swapping operation. The preferred first threshold (T) equals the cost of switching from one coding scheme to another, and then back again, for a total cost of 26 bits. The preferred first threshold (T), therefore, is 26. Preferably, the first threshold (T) is programmable.

The first threshold (T) may be positive or negative, depending on the current coding scheme. For example, as described further below with reference to the preferred embodiment of FIG. 2, when the current coding scheme is LZ1 coding and the compression potential sum S(p) reaches +26, the current coding scheme is swapped to RAW coding. Similarly, when the current coding scheme is RAW coding and the compression potential sum S(p) reaches −26, the current coding scheme is swapped to LZ1 coding.

With reference to step 206, if the data byte pointer (p) is less than or equal to N and the compression potential sum S(p) is greater than or equal to the first threshold (T) (e.g., +26), then it is more efficient to code the data within the coding window 108 by employing RAW coding. Subroutine 207 is invoked to swap coding schemes accordingly and to thereafter code the data within the coding window 108 using RAW coding.

Subroutine 207, in general, swaps the current coding scheme to a coding scheme "X" (e.g., either to LZ1 from RAW, or to RAW from LZ1). To swap coding schemes, the control code for switching to the desired coding scheme (e.g., SCHEME_X) is inserted in front of the data byte stream comprising the coding window 108. Thereafter, with the coding scheme set to X, the data bytes within the coding window 108 are coded (e.g., by supplying the appropriate scheme selection signal to the encoder 110 via the scheme selection control line 112) using coding scheme X, up to the last data byte creating a positive delta in the absolute value of the compression potential sum S(p). That is, up to the last data byte having a compression potential f(B) of the same sign as the other data bytes to be coded with coding scheme X. The contents of the coding window 108 then are shifted to the next un-encoded data byte supplied from the raw data byte source 106 (i.e., the coding window 108 is reset). The subroutine 207 ends by returning to step 200 to begin the compression potential analysis of a new set of data within the coding window 108.

Assuming the compression potential sum S(p) is less than the first threshold (T), in step 208, if the data byte pointer (p) is less than or equal to N and the compression potential sum S(p) is less than or equal to zero, then it is more efficient to code the data within the coding window 108 using the current LZ1 coding scheme. Subroutine 209, therefore, is called to perform the LZ1 coding.

Subroutine 209, in general, codes data within the coding window 108 employing the current coding scheme "X" (e.g., either LZ1 or RAW). Specifically, the p data bytes within the coding window 108 are coded using the current coding scheme X, and the contents of the coding window 108 are shifted to the next un-encoded data byte supplied from the raw data byte source 106. The subroutine 209 ends by returning to step 200 to begin the compression potential analysis of a new set of data within the coding window 108.

Assuming the compression potential sum S(p) is greater than zero, in step 210, if the data byte pointer (p) equals N (e.g., if the end of the coding window 108 has been reached), the compression potential sum S(p) is examined to determine if it has reached a second predetermined threshold (t) for swapping coding schemes. The second threshold (t) represents an "educated guess" as to whether to swap coding schemes based on the data bytes within the coding window 108 when the end of the coding window 108 is reached. Typically, the closer the compression potential sum S(p) is to the first threshold (T), the more educated a decision it is to adopt the coding scheme designated by the first threshold (T) (e.g., RAW coding for +26, LZ1 coding for −26). The preferred value for second threshold (t) is about ⅔ of the first threshold (T), or about +/−17. However, it will be understood that in general the choice of the second threshold (t) depends on many factors including but not limited to the nature of the data being compressed and the coding window size, and that in some applications (e.g., where the statistics of compressibility change within a given record) a smaller value may be preferred. Accordingly, the second threshold (t) preferably is programmable.

Returning to step 210, if when the end of the coding window 108 is reached (e.g., p=N) the compression potential sum S(p) equals or exceeds the second threshold (t), subroutine 207 is called to swap coding schemes from LZ1 to RAW, the data within the coding window 108 is coded as previously described, and new data bytes from the raw data byte source 106 are analyzed starting at step 200. However, if either the end of the coding window 108 or the second threshold (t) has not been reached, control passes to step 211.

In step 211, if the data byte pointer (p) equals N (e.g., if the end of the coding window 108 has been reached), and the compression potential sum S(p) is less than the second threshold (t), the data within the coding window 108 is encoded using LZ1 coding by calling subroutine 212 (described below); otherwise, because the compression potential sum S(p) has not reached the second threshold (t) at the end of the coding window 108 or has not reached the first threshold (T), or is not equal to or less than zero, analysis of the compression potential of the data bytes output from the raw data byte source 106 is continued at step 202.

The subroutine 212, in general, is similar to the subroutine 209. However, unlike the subroutine 209 which encodes p data bytes from the beginning of the coding window 108, the subroutine 212 encodes only one complete codeword from the start of the coding window 108 in the current scheme X, and the contents of coding window 108 are shifted to the next un-encoded data byte supplied from the raw data byte source 106. The subroutine 212 ends by returning to step 200 to begin the compression potential analysis of the data remaining within the coding window 108.

Returning to step 205, if the current coding scheme is RAW, the branch containing steps 213–216 is traversed, and operations similar to those described with reference to steps 206–211 are performed. Namely, in step 213, if the data byte pointer (p) is less than or equal to N and if the compression potential sum S(p) is less than or equal to the negative of the first threshold (T) (e.g., −T) for swapping coding schemes, then it is more efficient to code the data within the coding window 108 by employing LZ1 coding. Subroutine 207 is invoked to swap coding schemes accordingly, to code the data within the coding window 108 using LZ1 coding and to shift the contents of the coding window 108 to the next un-encoded data byte as previously described. Compression potential analysis then restarts at step 200.

If the compression potential sum S(p) is greater than the negative of the first threshold (T), in step 214, if the data byte pointer (p) is less than or equal to N and the compression potential sum S(p) is greater than or equal to zero, it is more efficient to code the data within the coding window 108 using the current RAW coding scheme. Subroutine 209 is called to perform this function, to shift the contents of the coding window 108 to the next un-encoded data byte and to restart compression potential analysis as previously described.

Assuming the compression potential sum S(p) is less than zero, in step 215, if the end of the coding window 108 is reached (e.g., p=N) and the compression potential sum S(p) is less than or equal to the negative of the second threshold (t), an educated guess is made to swap coding schemes from RAW to LZ1 and to encode the data within the coding window 108 accordingly (e.g., by calling the subroutine 207 as previously described); otherwise, in step 216, if the compression potential sum S(p) is greater than the negative of the second threshold (t), then the subroutine 212 is called to encode only one complete codeword from the start of the coding window 108 in the current RAW coding scheme. Thereafter, the contents of the coding window 108 are shifted to the next un-encoded data byte and compression analysis restarts in step 200.

If in step 216 either the end of the coding window 108 has not been reached or the compression potential sum S(p) is not greater than the negative of the second threshold (t), then analysis of the compression potential sum S(p) of the data bytes within the coding window 108 continues by incrementing the data byte pointer (p), by calculating the compression potential f(B(p)) of another data byte from the raw data byte source 106 and by adding the compression potential f(B(p)) to the compression potential sum S(p) as previously described (step 202).

Steps 217–221 are traversed when, in step 205, the current coding scheme is undetermined (i.e., RESET), such as during system start-up. In step 217, if the data byte pointer (p) is less than or equal to N and the compression potential sum S(p) is less than or equal to the negative of the first threshold (T), then the current coding scheme (e.g., undetermined) is reset to LZ1 by calling subroutine 218.

Subroutine 218, in general, resets the current coding scheme to a coding scheme "X" (e.g., either to LZ1 or to RAW). To reset the coding scheme to coding scheme X, the control code for setting the coding scheme to scheme X is inserted in front of the data byte stream comprising the coding window 108. Thereafter, with the coding scheme set to X, the data bytes within the coding window 108 are coded using coding scheme X, up to the last data byte creating a positive delta in the absolute value of the compression potential sum S(p). The contents of the coding window 108 then are shifted to the next un-encoded data byte supplied from the raw data byte source 106. The subroutine 218 ends by returning to step 200 to begin compression potential analysis of a new set of data within the coding window 108.

Assuming the compression potential sum S(p) is greater than the negative of the first threshold (T), in step 219, if the data byte pointer (p) is less than or equal to N and the compression potential sum S(p) is greater than the positive of the first threshold (T), then subroutine 218 is called to reset the current coding scheme to RAW, to code the p data bytes within the coding window 108, and to restart compression potential analysis at step 200 as described; otherwise, control passes to step 220.

In step 220, if the end of the coding window 108 has been reached (e.g., p=N) and the compression potential sum S(p) is less than or equal to zero, subroutine 218 is called to reset the current coding scheme to LZ1, to code the p data bytes within the coding window 108 and to restart compression potential analysis as described; otherwise, control passes to step 221.

In step 221, if the end of the coding window 108 has been reached, and the compression potential sum S(p) is greater than zero, subroutine 218 is called to reset the current coding scheme to RAW, to code the p data bytes within the coding window 108 and to restart compression potential analysis; otherwise, analysis of the compression potential sum S(p) of the data bytes within the coding window 108 continues with step 202.

In summary, the compression potential of data bytes within the coding window 108 is analyzed by computing the compression potential f(B(p)) of each data byte within the coding window 108, by adding to each data byte's compression potential f(B(p)) to a running compression potential sum S(p) and by determining whether to code the data bytes comprising the compression potential sum S(p) using LZ1 coding or RAW coding based on the value of the compression potential sum S(p), whether the end of the coding window 108 has been reached, and/or the current coding scheme.

Figure 3:
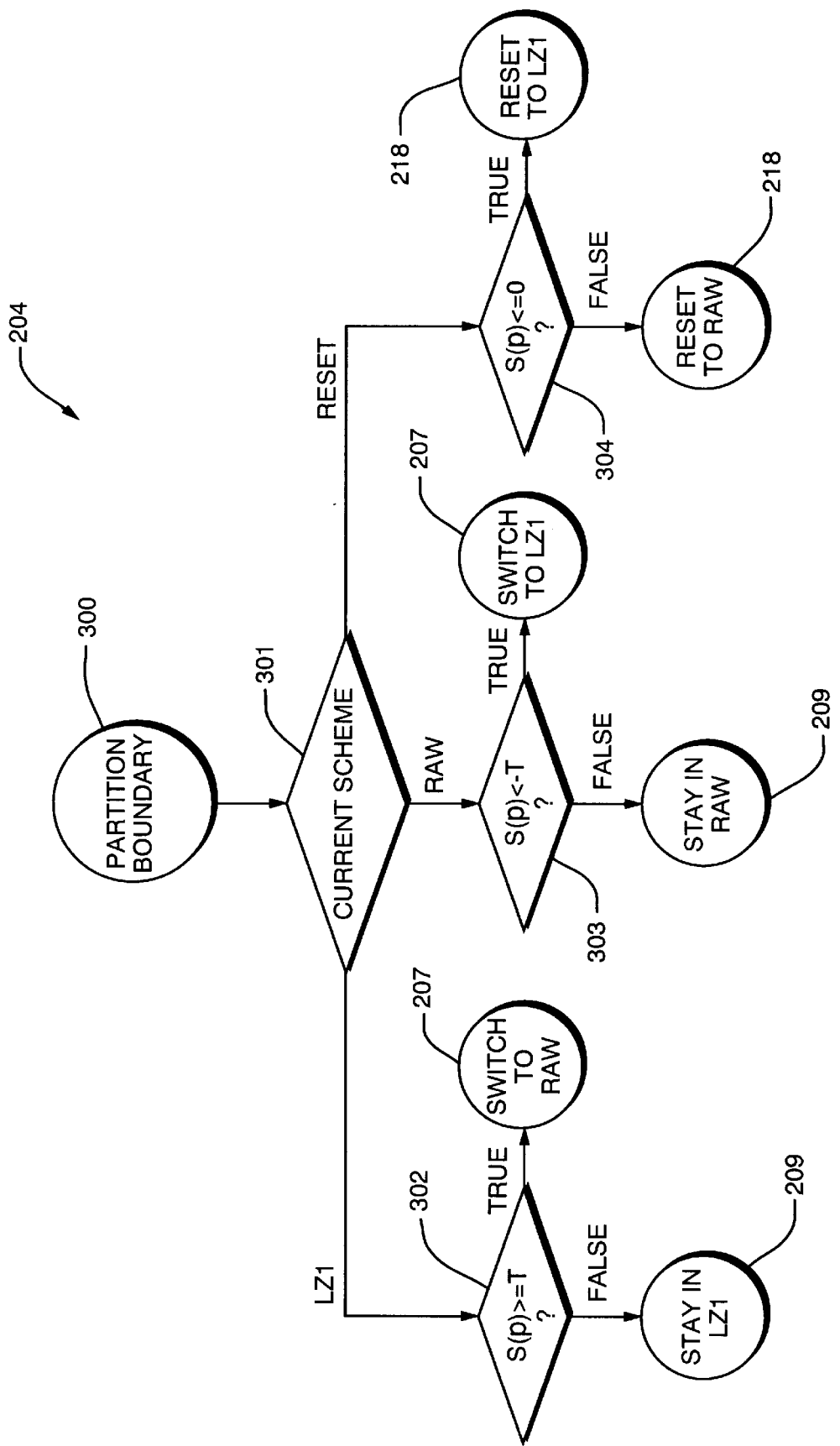
FIG. 3 is a flowchart of a coding subroutine called by the inventive coding selection algorithm of FIG. 2 when the end of a data partition is reached.

FIG. 3 is a flowchart of the subroutine 204 of FIG. 2 for addressing data coding when the end of a data partition is reached. With reference to FIGS. 2 and 3, when a partition boundary is reached during compression potential analysis (e.g., as identified in step 203), the subroutine 204 is called.

Subroutine 204 starts at step 300. In step 301, the current coding scheme is identified. If the current coding scheme is LZ1 coding, then step 302 is executed; if the current coding scheme is RAW coding, then step 303 is executed; or if the current coding scheme is undetermined (e.g., at start-up) then step 304 is executed.

In step 302, if the compression potential sum S(p) is greater than or equal to the first threshold (T), subroutine 207 is called to switch the current coding scheme (e.g., LZ1) to RAW and to code the data within the coding window 108 therewith; otherwise, if the compression potential sum S(p) is less than the first threshold (T), subroutine 209 is called to code the data within the coding window 108 using LZ1 coding.

In step 303, if the compression potential sum S(p) is less than the negative of the first threshold (T), subroutine 207 is called to switch the current coding scheme (e.g., RAW) to LZ1 and to code the data within the coding window 108 therewith; otherwise, if the compression potential sum S(p) is greater than the negative of the first threshold (T), subroutine 209 is called to code the data within the coding window 108 using RAW coding.

In step 304, if the compression potential sum S(p) is less than or equal to zero, subroutine 218 is called to reset the current coding scheme (e.g., undetermined) to LZ1 and to code the data within the coding window 108 therewith; otherwise, if the compression potential sum S(p) is greater than zero, subroutine 218 is called to reset the current coding scheme to RAW and to code the data within the coding window 108 therewith.

Figure 4A:
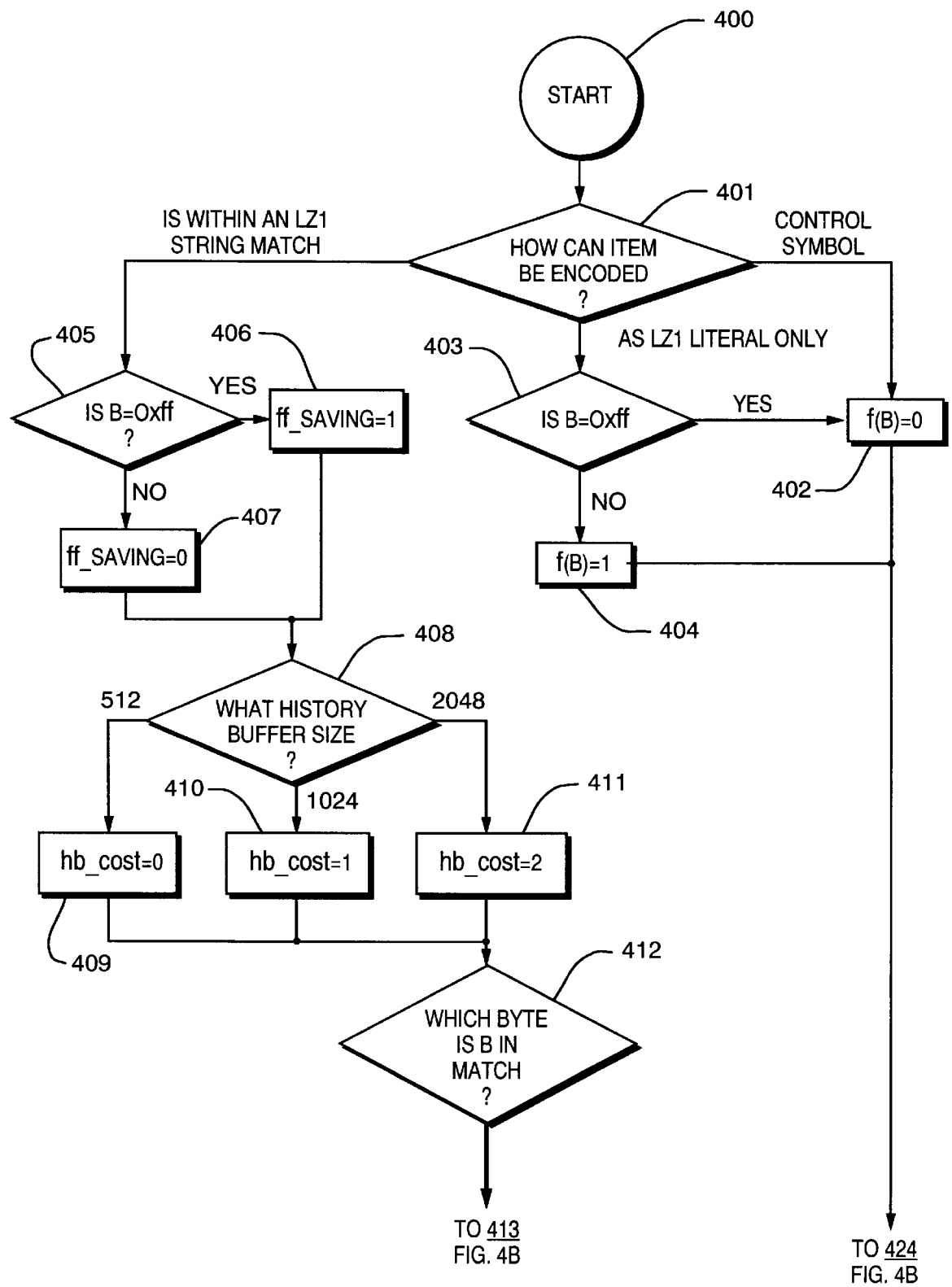
FIGS. 4(a)–4(b) are a flowchart of a coding subroutine called by the inventive coding selection algorithm of FIG. 2 for computing the compression potential of a data byte.
Figure 4B:
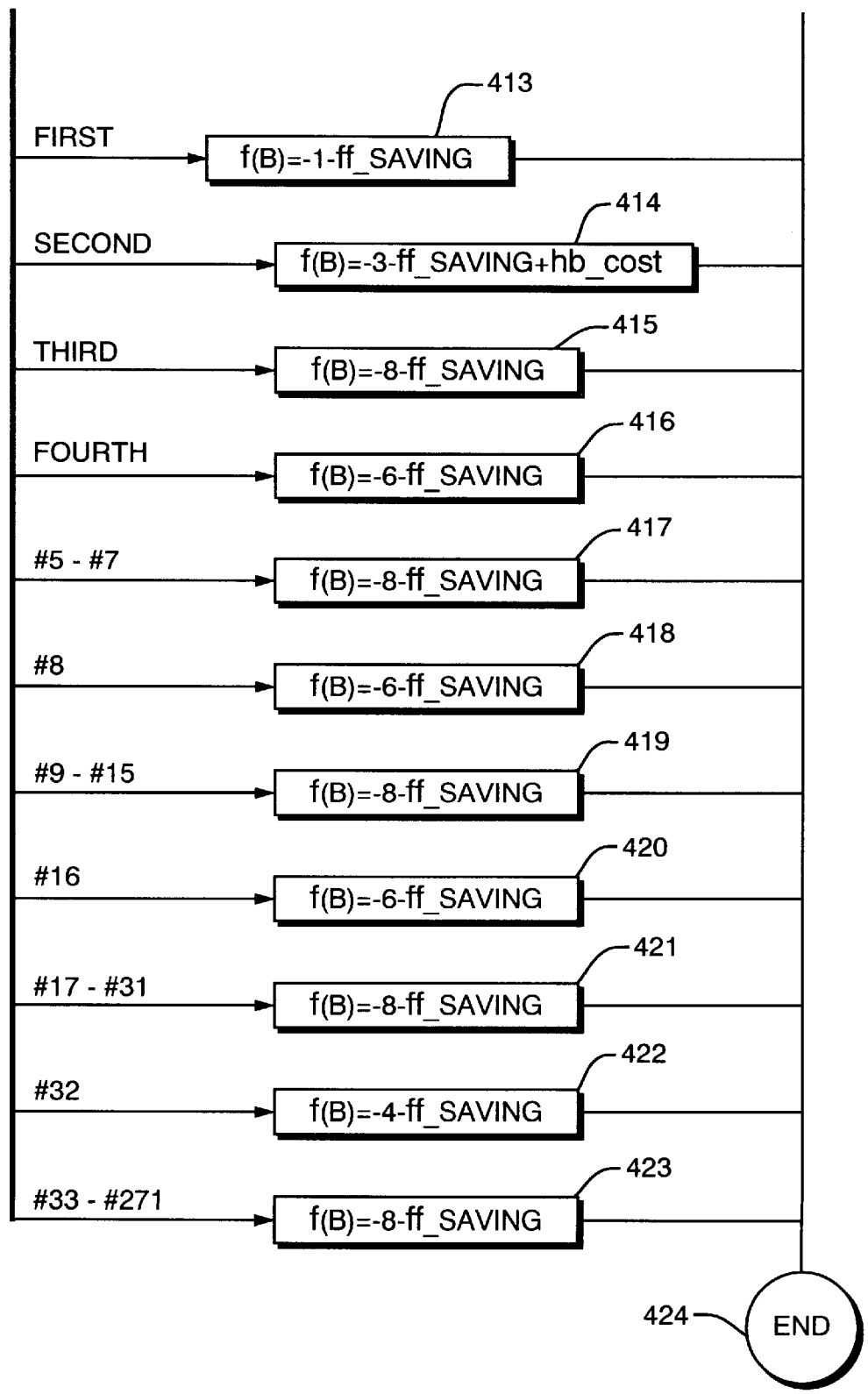

FIG. 4 is a flowchart of the computation of the compression potential f(B(p)) for each data byte (e.g., during step 202 in FIG. 2) within the coding window 108 during the computation of the compression potential sum S(p). Data byte compression potential computation starts at step 400.

In step 401, a data byte is analyzed to determine if the data byte is within an LZ1 string match (e.g., is encodeable as a copy pointer within the LZ1 coding scheme), is encodeable only as a literal within the LZ1 coding scheme or is a control symbol within the LZ1 coding scheme. If the data byte is a control symbol, the control symbol requires the same number of bits whether encoded in the LZ1 coding scheme or in the RAW coding scheme. As such, the compression potential f(B) for the control symbol is set to zero in step 402 so as to have no affect on the compression potential sum S(p).

If the data byte is encodeable only as a literal within the LZ1 coding scheme, in step 403 a determination is made as to whether the data byte is an 0xff data byte (e.g., requiring an additional bit to distinguish it from a control code). If the data byte is an 0xff data byte, due to the requirement for an extra bit to distinguish the data byte from a control code, the data byte will require the same number of bits whether encoded in the LZ1 or in the RAW coding scheme. As such, if the data byte is an 0xff data byte, the compression potential f(B) is set to zero in step 402 so as to have no affect on the compression potential sum S(p).

When the data byte is not an 0xff data byte, coding the data byte with the RAW coding scheme requires one less bit than coding the data byte with the LZ1 coding scheme. Accordingly, if the data byte is not an 0xff data byte, in step 404, the compression potential f(B) for the data byte is set to one to indicate that it is more favorable to employ RAW coding for the data byte.

If the data byte is within an LZ1 string match, in step 405 a determination is made as to whether the data byte is an 0xff data byte. If the data byte is an 0xff data byte, it is more favorable to encode the data byte using LZ1 coding, and a "savings" variable associated with coding an 0xff data byte using LZ1 coding ("ff-savings") is set to one in step 406; otherwise, if the data byte is not an 0xff data byte, in step 407 ff-savings is set to zero.

In step 408, the history buffer size if examined (e.g., to determine if a 512, 1024 or 2048 byte history buffer is being employed). As history buffer size increases, the number of bits required for each displacement field increases. The cost of coding in LZ1 thus increases with history buffer size, and a history buffer size cost variable ("hb-cost") is set to zero for a 512 byte history buffer (step 409), to one for a 1024 byte history buffer (step 410) and to two for a 2048 byte history buffer (step 411).

In step 412, the byte number that the data byte occupies within the string match is determined. In the preferred embodiment of FIG. 4, a string match of up to 271 data bytes may be analyzed to compute a compression potential f(B) for each data byte therein. It will be understood that other maximum data byte string match lengths may be employed if desired.

In steps 413–423, a compression potential f(B) for the data byte is computed based on the byte number the data byte occupies within the string match, the ff-savings value and for the second data byte within a string match, the hb-cost value. More specifically, for the first data byte within the string match (step 413) and for string match bytes 3–271 (steps 415–423) the compression potential f(B) equals the maximum number of bits that can be saved using LZ1 coding (e.g., based on the length associated with the displacement) plus the ff-savings. For the second data byte (step 414), the compression potential f(B) equals the maximum number of bits that can be saved using LZ1 coding plus the ff-savings and the hb-cost (e.g., to ensure a zero or positive value for f(B) is not inadvertently produced so as to cause the inventive algorithm to inadvertently employ RAW coding).

Once the compression potential f(B) is computed for a data byte in either steps 402, 404 or 413–423, in step 424 data byte compression potential analysis ends for the data byte. The data byte's compression potential f(B) then is added to the compression potential sum S(p) in step 202 as previously described.

By thus analyzing the compression potential of data bytes prior to coding, and by selecting an appropriate coding scheme based thereon, data compression may be performed with little data expansion.

As previously stated, the inventing coding selection algorithm of FIGS. 2–4 is implementable in either hardware, software or a combination thereof. In software form, the inventive coding selection algorithm may be programmed using any suitable programming language (e.g., C, C++, Pascal, assembly language and the like), and may be implemented as a computer program product carried by a medium readable by a computer (e.g., a carrier wave signal, a floppy disc, a hard drive, a random access memory, etc.).

Figure 5:
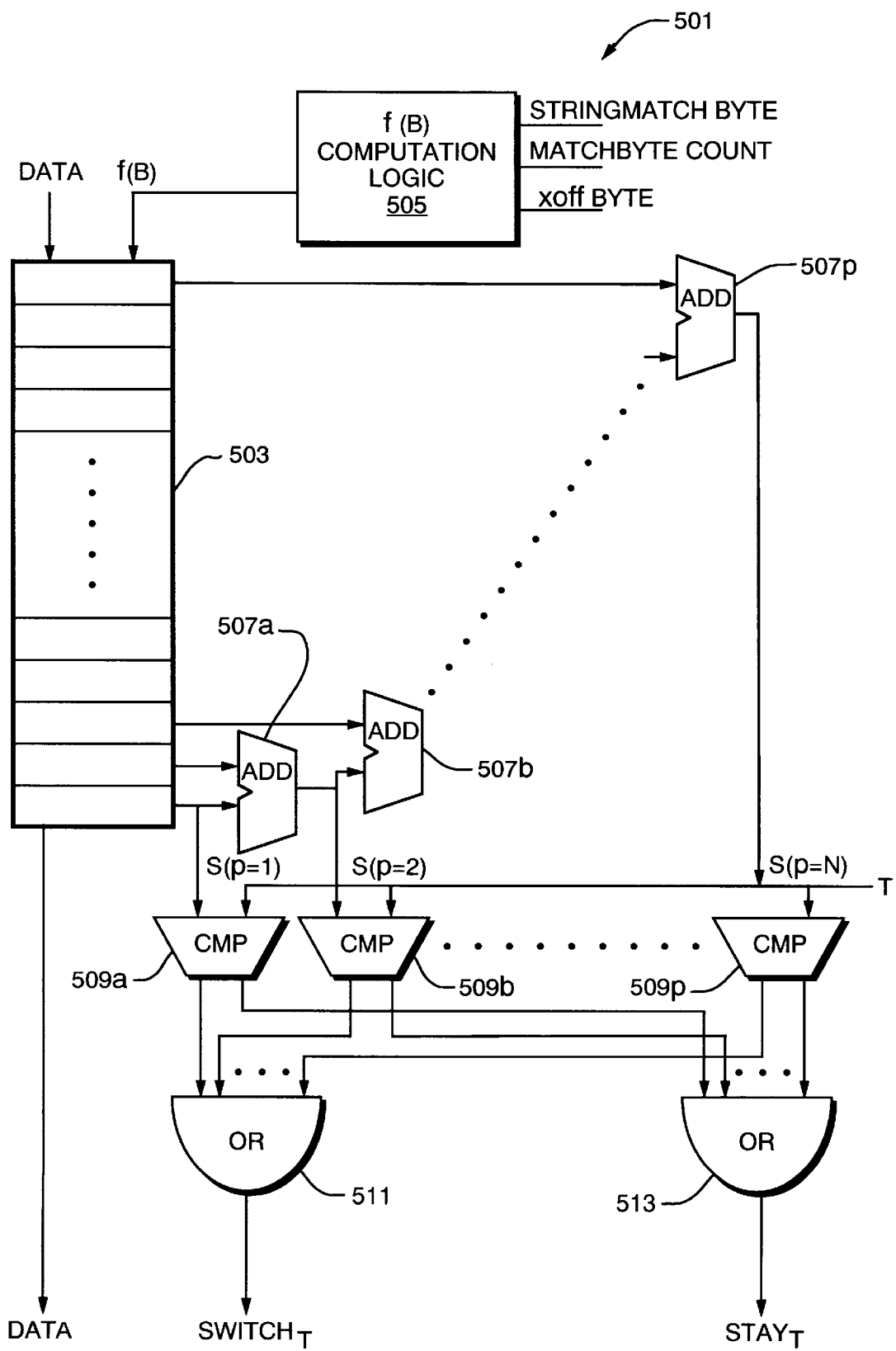
FIG. 5 is a schematic diagram of a coding window circuit that represents an exemplary hardware implementation of the inventive coding selection algorithm of FIGS. 2–4.

In hardware form, the inventive coding selection algorithm may be implemented using any known circuit elements. FIG. 5 is a schematic diagram of a coding window circuit 501 that represents an exemplary hardware implementation of the inventive coding selection algorithm of FIGS. 2–4. The coding window circuit 501 comprises a FIFO buffer 503 (e.g., preferably a 32, 64 or 128 byte FIFO buffer) coupled to f(B) computation logic 505 and a plurality of adders 507a–p. The f(B) computation logic 505 may comprise any logic suitable for computing the data byte compression potential f(B) in accordance with the algorithm of FIG. 4 (e.g., a decoder/adder logic circuit as is known in the art). The coding window circuit 501 further comprises a plurality of comparators 509a–p coupled to the FIFO buffer 503 and/or to the adders 507a–p as shown, and a first OR gate 511 and a second OR gate 513 coupled to the comparators 509a–p.

In operation, the coding window circuit 501 receives data bytes and history information from the FIFO 102 and the history buffer 104, respectively. Specifically, the FIFO buffer 503 receives and stores data bytes from the FIFO 102, and the f(B) computation logic 505 receives inputs from the history buffer 104 required to calculate the compression potential f(B) for each data byte supplied to the FIFO 503. For example, the f(B) computation logic 505 receives a stringmatch byte which indicates whether the most recently received data byte is part of a string match, a matchbyte count which identifies the byte number the most recently received data byte occupies in the string match, and a 0xff byte which identifies whether the most recently received data byte is an 0xff byte. Based thereon, the f(B) computation logic 505 computes the compression potential f(B) for the most recently received data byte in accordance with the algorithm of FIG. 4, and supplies the compression potential f(B) to the FIFO buffer 503. The FIFO buffer 503 stores the compression potential f(B) for each data byte (with its associated data byte) and is populated in a first-in/first-out manner.

As shown in FIG. 5, the adders 507a–p sum the compression potential f(B) for each data byte within the FIFO buffer 503 so as to compute a compression potential sum S(p) (e.g., starting from the first data byte p=1 to the last data byte p=N within the FIFO buffer 503). The compression potential sum S(p) is monitored (via the comparators 509a–p) at each location a data byte's compression potential f(B) is added to the compression potential sum S(p). If at any time the compression potential sum S(p) equals or exceeds the first threshold (T) (as indicated by one or more of the comparators 509a–p), a high logic level is generated by the one or more comparators 509a–p and is supplied to the first OR gate 511. In response thereto, the first OR gate 511 outputs a signal to the encoder 110 (via the scheme selection control line 112) that causes the current coding scheme used to code the data bytes within the FIFO buffer 503 (up to the last data byte creating a positive delta in the absolute value of the compression potential sum S(p)) to be swapped to another coding scheme as previously discussed, and the relevant data bytes within the FIFO buffer 503 to be coded therewith.

If the compression potential sum S(p) fails to exceed the first threshold (T) for all data bytes within the FIFO buffer 503, the comparators 509a–p output a high logic level to the second OR gate 513. In response thereto, the second OR gate 513 outputs a signal to the encoder 110 (via the scheme selection control line 112) that causes the data bytes within the FIFO buffer 503 to be coded using the current coding scheme (as described). The comparison of the compression potential sum S(p) to the second threshold (t) and to zero may be similarly implemented.

The foregoing description discloses only the preferred embodiments of the invention, modifications of the above disclosed apparatus and method which fall within the scope of the invention will be readily apparent to those of ordinary skill in the art. For instance, while the present invention has been described with reference to LZ1 coding, other coding schemes may be employed. Other values for the first and second thresholds may be used if desired, as may other coding window sizes, history buffer sizes and compression potential weighting. Further, while the present invention has been described with reference to LZ1 and pass-through (RAW) coding, it will be understood that other combinations of two or more coding schemes may be employed. As used herein, a "data byte" means any data set comprising one or more bits and should not be limited to the conventional definition of eight bits.

Accordingly, while the present invention has been disclosed in connection with the preferred embodiments thereof, it should be understood that other embodiments may fall within the spirit and scope of the invention, as defined by the following claims.

The invention claimed is:

1. A method used in a data compression process having two or more coding schemes, the method comprising:

providing a coding window that allows analysis of the compression potential of each byte of a sequence of bytes of data therewithin, wherein the coding window has a dynamically variable size p, wherein p is an integer number of bytes in the sequence and p is not greater than a predetermined maximum size N;

analyzing the data within the window, wherein analyzing the data within the window includes computing a compression potential sum Sp for p data bytes within the coding window according to the formula:

$$S_p = \sum_{n=1}^{p} f(W[n])$$

where $f(W[n])$ equals the compression potential of the nth data byte within the coding window; and swapping the coding scheme used to compress encode the data leaving the window from one scheme to another if the the absolute value of the compression potential sum ($|Sp|$) is equal to or greater than a first predetermined value T.

2. The method of claim 1 wherein providing a coding window comprises providing a first-in-first-out (FIFO) buffer for containing the coding window and having a physical byte size, and wherein the predetermined maximum data size N is equal to or less than the physical byte size of the FIFO buffer that contains the coding window.

3. The method of claim 1 wherein $f(W[n])$ for the nth data byte within the coding window is computed based upon the byte number (LZStringMatchByteNumber) that the nth data byte within the coding window occupies within a Lempel-Ziv string match, and also upon the ff-savings value (ff_saving), and if the nth byte is the second data byte within a string match (i.e., if LZStringMatchByteNumber=2) then also upon the hb-cost value;

and wherein $f(W[n])$ for the nth data byte within the coding window is equal to −1-ff_saving (i.e., $f(W[n])$=−1-ff_saving) if the nth data byte within the coding window is the first data byte within the Lempel-Ziv string match (i.e., if LZStringMatchByteNumber=1, then $f(W[n])$=−1-ff_saving); and and wherein $f(W[n])$ for the nth data byte within the coding window is equal to −3-ff_saving+hb_cost if the nth data byte within the coding window is the second data byte within the Lempel-Ziv string match (i.e., if LZStringMatchByteNumber=2, then $f(W[n])$=−3-ff_saving+hb_cost).

4. The method of claim 1 wherein swapping the coding scheme used to encode the data leaving the window from one scheme to another if the absolute value of the compression potential sum ($|Sp|$) is equal to or greater than a first predetermined value T comprises swapping the coding scheme used to encode the data leaving the window from one scheme to another if the absolute value of compression potential sum ($|Sp|$) is equal to or greater than a first predetermined value T.

5. The method of claim 1 wherein the first predetermined value T is a programmable value.

6. The method of claim 1 further comprising introducing a new data byte into the coding window and thereby increasing size p by one byte, and wherein analyzing the data within the window comprises:
   a) computing a data byte compression potential for the new data byte within the coding window; and
   b) adding the data byte compression potential of the new data byte to the compression potential sum;

and wherein swapping the coding scheme used to compress the data within the window from one scheme to another if the potential for compression reaches a first predetermined value comprises:
   c) swapping the coding scheme used to encode the data leaving the window from one scheme to another if the absolute value of the compression potential sum ($|Sp|$) is equal to or greater than the first predetermined value T.

7. The method of claim 6 further comprising:
   d) reducing the size p of the coding window if the coding scheme used to encode the data leaving the window is swapped from one scheme to another.

8. The method of claim 6 further comprising:
   d) swapping the coding scheme used to encode the data leaving the window from one scheme to another if both the coding window size p is equal to the predetermined maximum size N and the absolute value of the compression potential sum ($|Sp|$) is equal to or greater than a second predetermined value tt.

9. The method of claim 8 wherein the second predetermined value tt is a programmable value.

10. The method of claim 8 further comprising:
    e) swapping the coding scheme used to compress the data within the window from one scheme to another if a partition boundary of the data has been reached and the absolute value of compression potential sum ($|Sp|$) is equal to or greater than the first predetermined value T.

11. The method of claim 10 further comprising:
    f) repeating a)–e) if none of the following conditions exists:
       1) the coding scheme used to encode the data within the coding window is swapped from one scheme to another;
       2) the size p of the coding window is equal to N; or
       3) a partition boundary of the data is reached.

12. The method of claim 11 further comprising:
    g) reducing the size p of the coding window if at least one of conditions 1), 2) or 3) exists.

13. The method of claim 1 further comprising encoding a number of bytes q of the data bytes leaving the window, whereupon the size p of the coding window is reduced by q bytes (i.e., subtracting q from p).

14. A computer program product for use in a data compression process having two or more coding schemes, the product comprising:
   a medium readable by a computer, the computer readable medium having:
       means for providing a coding window that allows analysis of the compression potential of each byte of a sequence of bytes of data therewithin, wherein the coding window has a dynamically variable size p, wherein p is an integer number of bytes in the sequence and p is not greater than a predetermined maximum size N;
       means for analyzing the data within the window, wherein analyzing the data within the window includes computing a compression potential sum Sp for p data bytes within the coding window according to the formula:

$$S_p = \sum_{n=1}^{p} f(W[n])$$

where $f(W[n])$ equals the compression potential of the nth data byte within the coding window; and
       means for swapping the coding scheme used to encode the data leaving the window from one scheme to another if the absolute value of the compression potential sum ($|Sp|$) is equal to or greater than a first predetermined value T.

15. The computer program product of claim 14 wherein $f(W[n])$ for the nth data byte within the coding window is computed based upon the byte number (LZStringMatchByteNumber) that the nth data byte within the coding window occupies within a Lempel-Ziv string match, and also upon the ff-savings value (ff_saving), and if the nth byte is the second data byte within a string match (i.e., if LZStringMatchByteNumber=2) then also upon the hb-cost value;
    and wherein $f(W[n])$ for the nth data byte within the coding window is equal to –1-ff_saving (i.e., $f(W[n])$=–1-ff_saving) if the nth data byte within the coding window is the first data byte within the Lempel-Ziv string match (i.e., if LZStringMatchByteNumber=1, then $f(W[n])$=–1-ff_saving); and
    and wherein $f(W[n])$ for the nth data byte within the coding window is equal to –3-ff_saving+hb_cost if the nth data byte within the coding window is the second data byte within the Lempel-Ziv string match (i.e., if LZStringMatchByteNumber=2, then $f(W[n])$=–3-ff_saving+hb_cost).

16. The computer program product of claim 14 wherein swapping the coding scheme used to encode the data leaving the window from one scheme to another if the absolute value of the compression potential sum ($|Sp|$) is equal to or greater than a first predetermined value T comprises swapping the coding scheme used to encode the data leaving the window from one scheme to another if the absolute value of compression potential sum ($|Sp|$) is equal to or greater than a first predetermined value T.

17. The computer program product of claim 14 further comprising means for programming the first predetermined value T.

18. The computer program product of claim 14 further comprising introducing a new data byte into the coding window and thereby increasing size p by one byte, and wherein the means for analyzing the data within the window comprises:
    a) means for computing a data byte compression potential for the new data byte within the coding window; and
    b) means for adding the data byte compression potential of the new data byte to the compression potential sum;

and wherein the means for swapping the coding scheme used to compress the data within the window from one scheme to another if the potential for compression reaches a first predetermined value comprises:

c) means for swapping the coding scheme used to encode the data leaving the window from one scheme to another if the absolute value of the compression potential sum ($|Sp|$) is equal to or greater than the first predetermined value T.

19. The computer program product of claim 18 further comprising:

d) means for reducing the size p of the coding window if the coding scheme used to encode the data leaving the window is swapped from one scheme to another.

20. The computer program product of claim 18 further comprising:

d) means for determining whether the coding window size p is equal to the predetermined maximum size N; and means for swapping the coding scheme used to encode the data leaving the window from one scheme to another when both the coding window size p is equal to the predetermined maximum size N and the absolute value of the compression potential sum ($|Sp|$) is equal to or greater than a second predetermined value tt.

21. The computer program product of claim 20 further comprising means for programming the second predetermined value tt.

22. The method of claim 20 further comprising:

e) means for determining whether a partition boundary of the data has been reached, and;

means for swapping the coding scheme used to encode the data leaving the window from one scheme to another when a partition boundary of the data has been reached and the absolute value of compression potential sum ($|Sp|$) is equal to or greater than the first predetermined value T.

23. The computer program product of claim 22 further comprising:

f) means for detecting whether at least one of the following conditions is true:

1) the coding scheme used to compress the data within the coding window is swapped from one scheme to another;
    2) the coding window size p is equal to the predetermined maximum size N; or
    3) a partition boundary of the data is reached.

24. The computer program product of claim 23 further comprising:

g) means for reducing the size p of the coding window if at least one of conditions 1), 2) or 3) is true.

25. A coding window circuit adapted to allow the analysis of the compression potential of data, the coding window circuit comprising:

a first calculation circuit adapted to compute the compression potential of a data byte;

a buffer having a physical buffer size (PBS), being coupled to the first calculation circuit and adapted to store a dynamically variable number (p) of data bytes, including the data byte and the computed compression potentials of each of the p stored data bytes, wherein p is less than or equal to PBS;

a second calculation circuit coupled to the buffer and adapted to compute a compression potential sum based on the computed compression potentials of the p data bytes stored within the buffer; and a comparison circuit coupled to the second calculation circuit and adapted to generate a signal that swaps the coding scheme used to encode data bytes leaving the buffer from one scheme to another if the absolute value of the computed compression potential sum is greater than or equal to the first predetermined value T.

26. The coding window circuit of claim 25 wherein the comparison circuit is further adapted to generate a signal that swaps the coding scheme used to encode data bytes leaving the buffer from one scheme to another if both p equals PBS and the absolute value of the computed compression potential sum is greater than or equal to the second predetermined value tt.

* * * * *